United States Patent
Harrison et al.

(10) Patent No.: US 8,487,440 B2
(45) Date of Patent: Jul. 16, 2013

(54) BACKSIDE PROCESSING OF SEMICONDUCTOR DEVICES

(75) Inventors: Mark Harrison, Wernberg (AT); Evelyn Napetschnig, Diex (AT); Franz Stueckler, Stefan (AT)

(73) Assignee: Infineon Technologies AG, Neubiberg (DE)

( * ) Notice: Subject to any disclaimer, the term of this patent is extended or adjusted under 35 U.S.C. 154(b) by 273 days.

(21) Appl. No.: 12/833,755

(22) Filed: Jul. 9, 2010

(65) Prior Publication Data
US 2012/0007244 A1    Jan. 12, 2012

(51) Int. Cl.
*H01L 23/482* (2006.01)
*H01L 21/30* (2006.01)
*H01L 21/768* (2006.01)

(52) U.S. Cl.
USPC ........................................ 257/763

(58) Field of Classification Search
USPC ........... 257/763, E21.212, E21.575, E23.012; 438/655, 710, 656, 721, 572, 612, 614
See application file for complete search history.

(56) References Cited

U.S. PATENT DOCUMENTS

| | | | |
|---|---|---|---|
| 5,252,181 A | 10/1993 | Dutartre et al. | |
| 5,587,039 A * | 12/1996 | Salimian et al. | 156/345.41 |
| 5,833,758 A | 11/1998 | Linn et al. | |
| 5,980,265 A * | 11/1999 | Tischler | 438/93 |
| 6,124,218 A * | 9/2000 | Hwang | 438/788 |
| 6,776,874 B2 * | 8/2004 | Kobayashi et al. | 156/345.51 |
| 2003/0236003 A1 * | 12/2003 | Koo et al. | 438/795 |
| 2004/0137750 A1 | 7/2004 | Nemoto et al. | |
| 2005/0136576 A1 * | 6/2005 | Ishihara et al. | 438/162 |
| 2008/0230911 A1 | 9/2008 | Li | |
| 2008/0237779 A1 * | 10/2008 | Yamazaki et al. | 257/507 |
| 2008/0296627 A1 | 12/2008 | Watanabe et al. | |
| 2009/0286382 A1 * | 11/2009 | Huff | 438/455 |
| 2010/0167485 A1 * | 7/2010 | Wang et al. | 438/299 |
| 2012/0214303 A1 * | 8/2012 | Ganguli et al. | 438/664 |

* cited by examiner

*Primary Examiner* — Dao H Nguyen
*Assistant Examiner* — Tram H Nguyen
(74) *Attorney, Agent, or Firm* — Slater & Matsil, L.L.P.

(57) ABSTRACT

A semiconductor device includes a workpiece having a bottom surface opposite the top surface. Metallization layers are disposed over the top surface and a protective layer is disposed over the metallization layers. The semiconductor device further includes a metal silicide layer disposed on the bottom surface. The metal silicide layer is less than about five atomic layers in thickness. A first metal layer is disposed over the metal silicide layer such that a metal of the first metal layer is the same as a metal of the metal silicide layer.

49 Claims, 7 Drawing Sheets

US 8,487,440 B2

BACKSIDE PROCESSING OF SEMICONDUCTOR DEVICES

TECHNICAL FIELD

The present invention relates generally to semiconductor devices, and, in particular embodiments, to backside processing of semiconductor devices.

BACKGROUND

Semiconductor devices are used in many electronic and other applications. Semiconductor devices comprise integrated circuits that are formed on semiconductor wafers by depositing many types of thin films of material over the semiconductor wafers, and patterning the thin films of material to form the integrated circuits.

Semiconductor devices are coupled to external circuits through front-side and backside contacts. Forming backside contacts with low resistance is one of the challenges with integrated circuits especially as package dimensions are scaled down.

SUMMARY OF THE INVENTION

In accordance with an embodiment of the invention, a semiconductor device includes a workpiece having a bottom surface opposite a top surface. Metallization layers are disposed over the top surface and a protective layer is disposed over the metallization layers. In accordance with an embodiment, the semiconductor device further includes a metal silicide layer disposed on the bottom surface. The metal silicide layer is less than about five atomic layers in thickness. A first metal layer is disposed over the metal silicide layer such that a metal of the first metal layer is the same as a metal of the metal silicide layer.

In accordance with an embodiment of the present invention, a method of fabricating a semiconductor device includes forming circuitry adjacent a top surface of a workpiece. The workpiece has a first bottom surface opposite the top surface. The first bottom surface of the workpiece is exposed to a hydrogen plasma. The hydrogen plasma removes a native oxide from the first bottom surface to expose a second bottom surface of the workpiece. A root mean square value of surface roughness of the second bottom surface is less than about 1 nm.

In accordance with another embodiment of the present invention, a method of fabricating a semiconductor device includes forming a doped region on a top surface of a workpiece, the workpiece having a first bottom surface opposite the top surface. The workpiece is placed in a plasma etch tool chamber, and argon at a first flow rate and hydrogen at a second flow rate are introduced into the plasma etch tool chamber. The hydrogen plasma is ignited and the flow rate of hydrogen is increased to a third flow rate. The hydrogen plasma removes a native oxide from the first bottom surface to expose a second bottom surface of the workpiece.

BRIEF DESCRIPTION OF THE DRAWINGS

For a more complete understanding of the present invention, and the advantages thereof, reference is now made to the following descriptions taken in conjunction with the accompanying drawing, in which:

FIG. 1, which includes FIGS. 1a and 1b, illustrates a cross sectional view of a semiconductor device in accordance with an embodiments, wherein FIG. 1a illustrates a cross sectional view and FIG. 1b illustrates a magnified view of the semiconductor device;

DETAILED DESCRIPTION OF ILLUSTRATIVE EMBODIMENTS

Figure 1A:
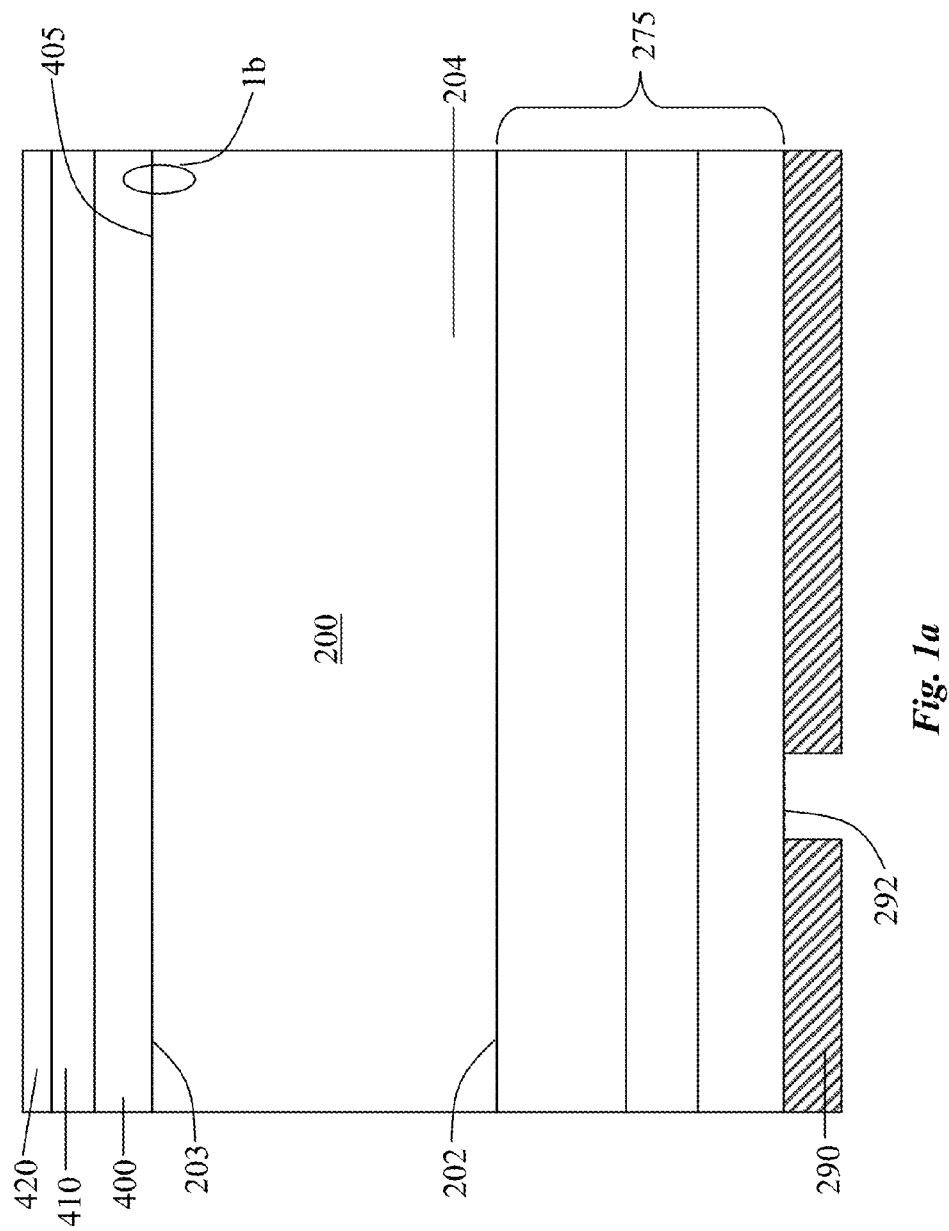

The making and using of various embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The present invention will be described with respect to various embodiments in a specific context, namely back side contacts for semiconductor devices. The invention may also be applied, however, to other types of devices and contacts.

Reliable removal of native oxide and impurities from the back surface of a wafer is important for forming contacts. Typically argon sputtering or wet etching is used for cleaning the surface prior to contact formation. However both methods result in unsatisfactory cleaning.

Argon sputtering creates silicon debris and deposits particles on chamber walls. Further, argon sputtering adds carbon into the silicon, a leading contaminant during contact formation, by removing carbon from the layer protecting the front side of the wafer. Argon sputtering knocks carbon atoms from the protective layer thereby introducing carbon into the contact region and increasing the contact resistance. Alternatively, high temperature anneals are required to mitigate the negative impact of carbon. These anneals degrade the metallization already formed on the front side of the wafer. Additionally, the high energy argon ions introduce silicon lattice damage creating n-type regions. Alternatives such as wet etching using HF, alloy post deposition are also not satisfactory due to introduction of fluorine contaminants, the inability to process thin wafers, and increased fabrication costs.

Alternatively, an aluminum layer has been added at the interface between the silicon substrate and titanium which is used for contact formation. The aluminum forms a low temperature eutectic with silicon mitigating the need to anneal the wafer at high temperatures to remove the contaminants. However, aluminum corrodes easily and is susceptible to spiking (metal spikes) and hence can not be used for small packages.

In the absence of an aluminum layer, a high temperature anneal is required for bond formation between titanium and silicon. The high temperature anneal is needed to mitigate the negative impact of carbon contaminants and/or replace the strongly bound fluorine atoms (Si-F bonds) with titanium atoms forming silicon-titanium bonds. However, high temperature anneals can damage already formed front end metallization layers.

In various embodiments, the present invention overcomes these and other problems by the use of hydrogen plasma etching, which can also work with a smooth surface having hydrogen terminated silicon atoms that easily convert to metal terminated silicon atoms (thereby a metal silicide) resulting in improved mechanical contact with good ohmic resistance. Advantageously, the improvements are achieved without any significant cost increase or degradation of the front side metallization or devices.

Conventionally hydrogen plasma has been used for cleaning epitaxial wafers. For example, Electron Cyclotron Resonance (ECR) plasma has been used to clean hydrocarbons and native oxide from silicon surfaces.

Structural embodiments of the invention will be first described using FIG. 1. A method of fabricating a semiconductor device will be described using FIGS. 2-5. A plasma chamber implementing embodiments of the invention will be described using FIG. 6.

Figure 1B:
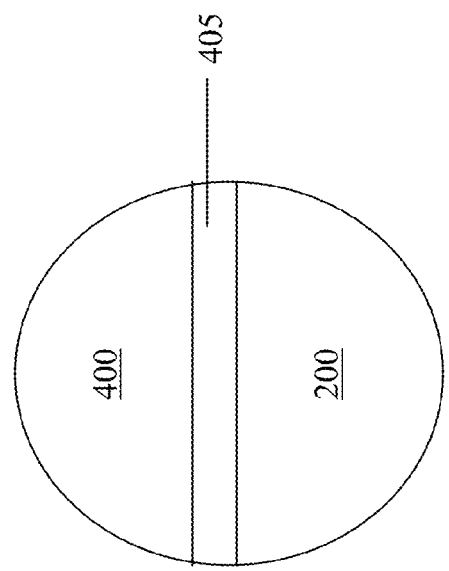

FIG. 1, which includes FIGS. 1a and 1b, illustrates a semiconductor device in accordance with an embodiment of the invention.

FIG. 1a illustrates a cross sectional view of a semiconductor device having a substrate 200. The substrate 200 includes a top surface 202 and an opposite bottom surface 203. In various embodiments, the substrate 200 comprises silicon or other semiconductor materials including compound semiconductors such as Ge, InSb, GaAs, GaN, InP, SiGe, or SiC, as examples. The substrate may also comprise a semiconductor on insulator substrate such as silicon-on-insulator (SOI).

The substrate 200 includes device regions 204 adjacent the top surface 202. The device regions 204 may comprise active circuitry and can include transistors, resistors, capacitors, inductors, or other components used to form integrated circuits. The device regions 204 may include a plurality of devices (integrated circuit) or a discrete device. The devices in the device regions 204 may be separated by suitable means including isolation trenches and doping schemes such as well isolations, as examples.

A plurality of metallization layers are disposed over the device regions 204 and form the back end of the line (BEOL) layer 275. The BEOL layer 275 can include many levels of metal lines and vias, which together interconnect the devices within the device 204 as well as provide electrical connections to external circuitry or adjacent circuits on the substrate 200. The number of metal levels within the BEOL layer 275 is selected based on the type of devices in the device regions 200. For example, the BEOL layer 275 over logic devices may include many layers, e.g., nine or more, of copper. In memory devices such as DRAMs, or analog devices, the number of metal levels may be less and may be aluminum. The BEOL layer 275 and device regions 200 together form a completed functional integrated circuit. In other words, the electrical functions of the chip can be performed by the interconnected active circuitry.

A passivation layer 290 may be formed over the BEOL layer 275 to protect and passivate the BEOL layer 275. The passivation layer 290 may include bond pads 292 to connect external circuitry to the BEOL layer 275. Alternatively, other types of contacts including under-bump metallization (UBM) and/or redistribution lines (RDL) may be formed to suitably connect the external circuitry to the BEOL layer 275.

Referring to FIG. 1a, the substrate 200 also includes back side metallization over the bottom surface 203. The back side metallization may be used to form a solder contact to create an electrical contact to the semiconductor (ohmic contact), to contact a through substrate via (TSV) with a UBM or RDL for chip stacking, and/or for an efficient heatsink.

The bottom surface 203 of the substrate 200 comprises a smooth surface in various embodiments. In various embodiments, the root mean square value of surface roughness of the bottom surface is less than about 1 nm. A first metal layer 400 is disposed over the bottom surface 203. In various embodiments, the first metal layer 400 is about 10 nm to about 200 nm in thickness.

In various embodiments, the first metal layer 400 comprises titanium or tungsten. The first metal layer 400 is chosen to improve adhesion and provide good mechanical and ohmic contact in some embodiments. The contact materials subsequently formed may have high intrinsic stress or may develop high stresses during product lifetime or further processing so that the contact may peel off from the substrate 200. In various embodiments, the first metal layer 400 improves mechanical properties by stronger bonding with the substrate 200.

FIG. 1b illustrates a magnified cross-sectional view as shown in the circle in FIG. 1a at the interface between the first metal layer 400 and the substrate 200. Referring to FIG. 1b, a metal silicide layer 405 is disposed over an entire bottom surface 203 of the substrate 200. In various embodiments, the metal silicide layer 405 is less than about five atomic layers in thickness. In various embodiments, the metal silicide layer 405 is less than about 2 nm in thickness, and less than about 1 nm in one embodiment. The existence of the metal silicide layer 405 improves the mechanical and ohmic contact in various embodiments.

In some embodiments, a second metal layer 410 may be disposed over the first metal layer 400. The second metal layer 410 provides a solder layer for contact formation. In some embodiments, the second metal layer 410 may be chosen as a seed layer for subsequent solder layers. In various embodiments, the second metal layer 410 is about 100 nm to about 500 nm in thickness. In one embodiment, the second metal layer 410 comprises nickel and/or vanadium, while in various embodiments, the second metal layer 410 may comprise any suitable metal.

A third metal layer 420 is disposed over the second metal layer 410. In various embodiments, the third metal layer 420 solders with the second metal layer 410 and also protects the underlying metals from the environment. Examples of the third metal layer 420 include Au, Ag, Au alloys, Ag alloys, and combinations thereof. In some embodiments, copper may be used as the third metal layer 420. In various embodiments, the third metal layer 420 comprises a thickness of about 100 to about 10000 nm.

FIGS. 2-5 illustrate a method of fabricating a semiconductor device in accordance with embodiments of the invention.

Figure 2:
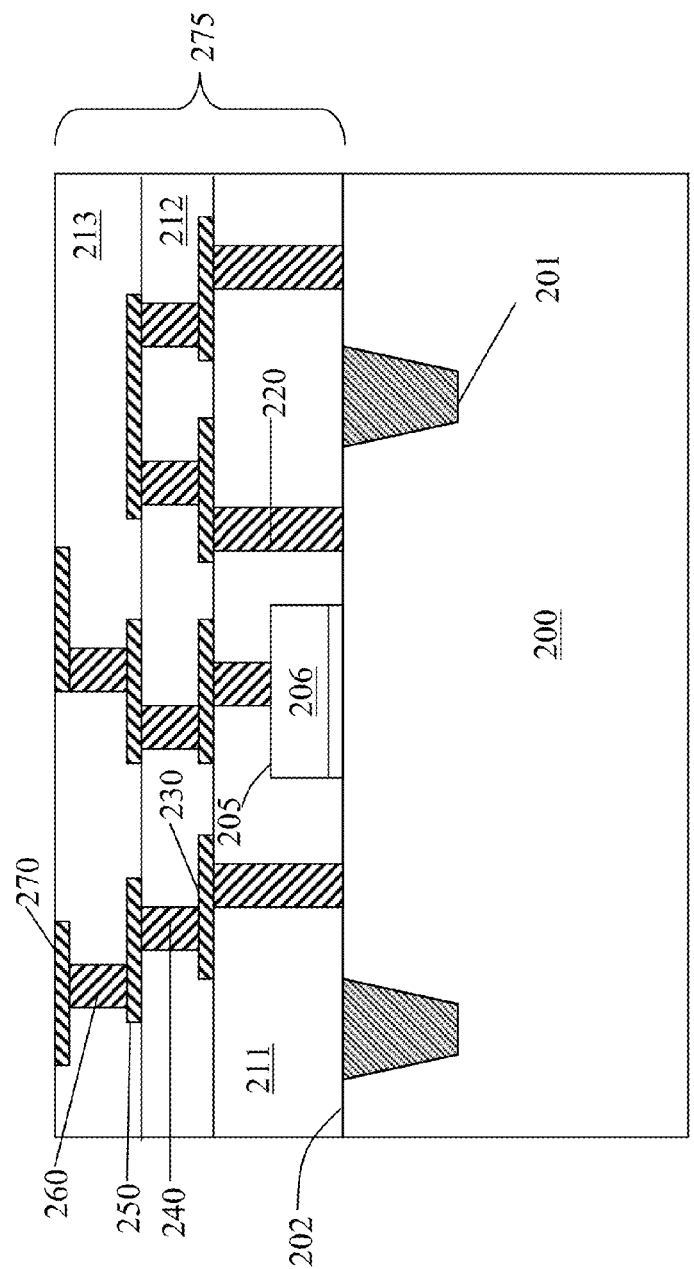
FIG. 2-5 illustrates a cross sectional view of a semiconductor device in various stages of fabrication in accordance with an embodiment of the invention.

Referring to FIG. 2, device regions are formed on a top surface 202 of a substrate 200. As illustrated in FIG. 2, isolation trenches 201 may be formed isolating various devices. Other types of isolation may be also formed by implanting dopants into the substrate 200.

The device regions having at least a device 205 are formed within or over the substrate 200. The device regions may include isolation regions 201. The device 205 formed adjacent the top surface 202 may include many types of devices such as bipolar transistors, p-n diodes, transistors etc. The device 205 may be formed as a large discrete device wherein the substrate 200 comprises only a single device. Alternatively, in some embodiments, the device 205 may be formed as a passive device within the metallization layers (described below). Examples of such passive devices include resistor, capacitors such as metal/insulator/metal capacitors, and inductors.

In one or more embodiments, the device 205 may comprises micro-electro-mechanical system (MEMS) devices. In general, the device 205 can be any type of device including any active or passive semiconductor device as well other non-semiconducting devices.

The device 205 may contain features such as a gate electrode 206, which may control the operation of the device 205. In various embodiments, the gate electrode 206 may be part of a field effect transistor or a bipolar transistor such as an insulated gate bipolar transistor (IGBT). In various embodiments, the device 205 may be formed by doping regions of the substrate 200 with dopants to render certain regions n-type or p-type. In some embodiments, the device 205 may not include such features as the gate electrode 205.

Next, metallization is formed over the device regions to electrically contact and interconnect the device regions. The components formed during the front-end processing are interconnected by back end of line (BEOL) processing. During this process, contacts are made to the top surface 202 of the substrate 200 and are interconnected using metal lines and vias. As discussed above, modern integrated circuits incorporate many layers of vertically stacked metal lines and vias (multilevel metallization) that interconnect the various components in the chip.

In FIG. 2, only three levels of metal are illustrated, however, more or fewer metallization levels may be formed in other embodiments. First, second, and third metallization insulation layers 211, 212, and 213 are formed above a substrate 200. Each of the first, second, and third metallization insulation layers 211, 212, and 213 may comprise multiple layers. The first, second, and third metallization insulation layers 211, 212, and 213 may be separated by etch stop liners (not shown).

In one embodiment, the first metallization insulation layer 211 comprises an oxide such as tetra ethyl oxysilane (TEOS) or fluorinated TEOS (FTEOS), but various embodiments may comprise insulating materials typically used in semiconductor manufacturing for inter-level dielectric (ILD) layers. The first metallization insulation layer 211 may comprise a thickness of about 500 nm or less, for example, although alternatively, the first metallization insulation layer 120 may comprise other dimensions.

The second and third metallization insulation layers 212 and 213 comprise insulating materials typically used in semiconductor manufacturing for inter-level dielectric (ILD) layers, such as $SiO_2$, tetra ethyl oxysilane (TEOS), or a lower dielectric constant material such as fluorinated TEOS (FTEOS), doped glass (BPSG, PSG, BSG), organo silicate glass (OSG), fluorinated silicate glass (FSG), or spin-on glass (SOG). The second and third metallization insulation layers 212 and 213 may also comprise ultra-low k materials including porous dielectric materials.

First vias 220 or contact plugs are formed within the first metallization insulation layer 211. Similarly, first metal lines 230 are formed within the second metallization insulation layer 212. Similarly, second vias 240, second metal lines 250, third vias 260, and third metal lines 270 are formed until all metallization layers are completed. The metallization layers may be formed using either damascene or dual-damascene processes in various embodiments.

The vias and metal lines are formed from suitable metals. In some embodiments, the second and the third vias 240 and 260 comprise a copper core with an outer liner, e.g., of tantalum nitride and tantalum. In alternative, embodiments, the second and the third vias 240 and 260 may comprise tungsten core and outer liners of titanium and titanium nitride or other metal liners or liner combinations. In yet another embodiment, the second and the third vias 240 and 260 may comprise aluminum.

Figure 3:
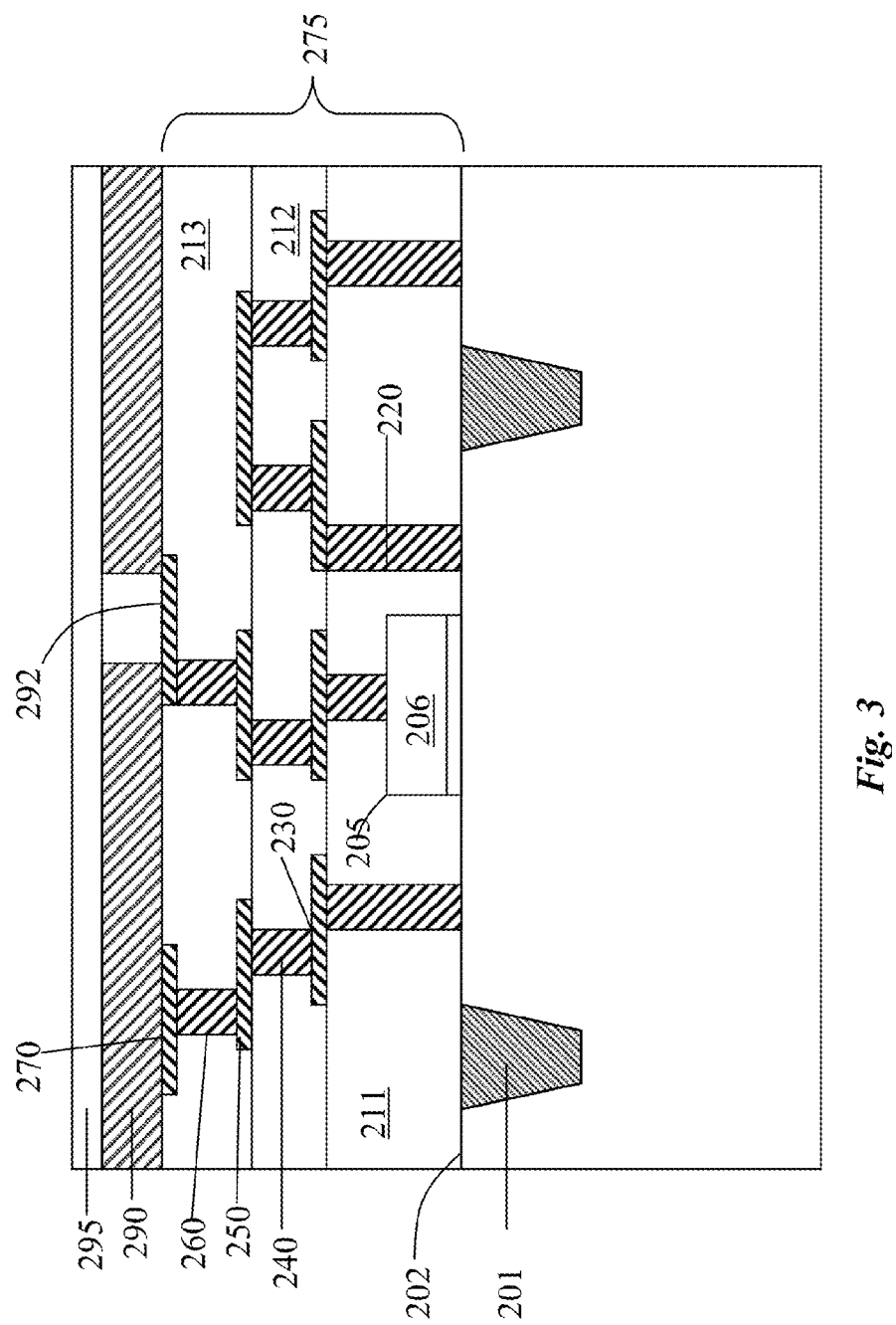

At this stage of processing, the back end processes are also completed, and hence all the metallization levels connecting the device 205 are fabricated. A passivation layer 290 is deposited over the last metal level (FIG. 3). External contact circuitry (not shown) may be formed within the passivation layer 290 to contact the bond pads 292 in the last metal level. The external contact circuitry may include UBMs and RDLs in various embodiments. A protective layer 295 may be deposited over the passivation layer 290 to protect the passivation layer 290 during subsequent processing. The protective layer 295 may comprise a hard mask layer or a resist material, in some embodiments. In one embodiment, the protective layer 295 comprises an imide layer.

Next, the backside of the substrate 200 is prepared for contact formation. The backside contact is formed as a large blanket contact in various embodiments. In one or more embodiments, the backside contact completely covers (or covers at least 80%) the backside of the substrate 200 (wafer). Forming good contacts especially with WTi (tungsten-titanium) and Ti (titanium) is difficult because of poor adhesion with the substrate 200. The presence of impurities or contaminants reduces the adhesion of Ti or WTi layers. As a consequence, any heating of the substrate 200 which may result in out-gassing of impurities must be avoided. For example, carbon may out-gas from imide if the substrate 200 is heated resulting in poor contact formation.

In some embodiments, the substrate 200 may be thinned. In such embodiments, the substrate 200 may be thinned from the back side and passivated. For ease of handling during the thinning process, the protective layer 295 may be attached to a carrier tape. The substrate 200 is thinned exposing a lower surface by grinding to a desired thickness. The typical thickness of the substrate 200 after the thinning is about 20 µm to about 400 µm. In different embodiments, the thinning may also be performed chemically or by using a plasma etch. For example, a modified plasma etch may be used to thin the silicon wafer from the back side. Such techniques have the additional advantage of not damaging the front side.

Figure 6:
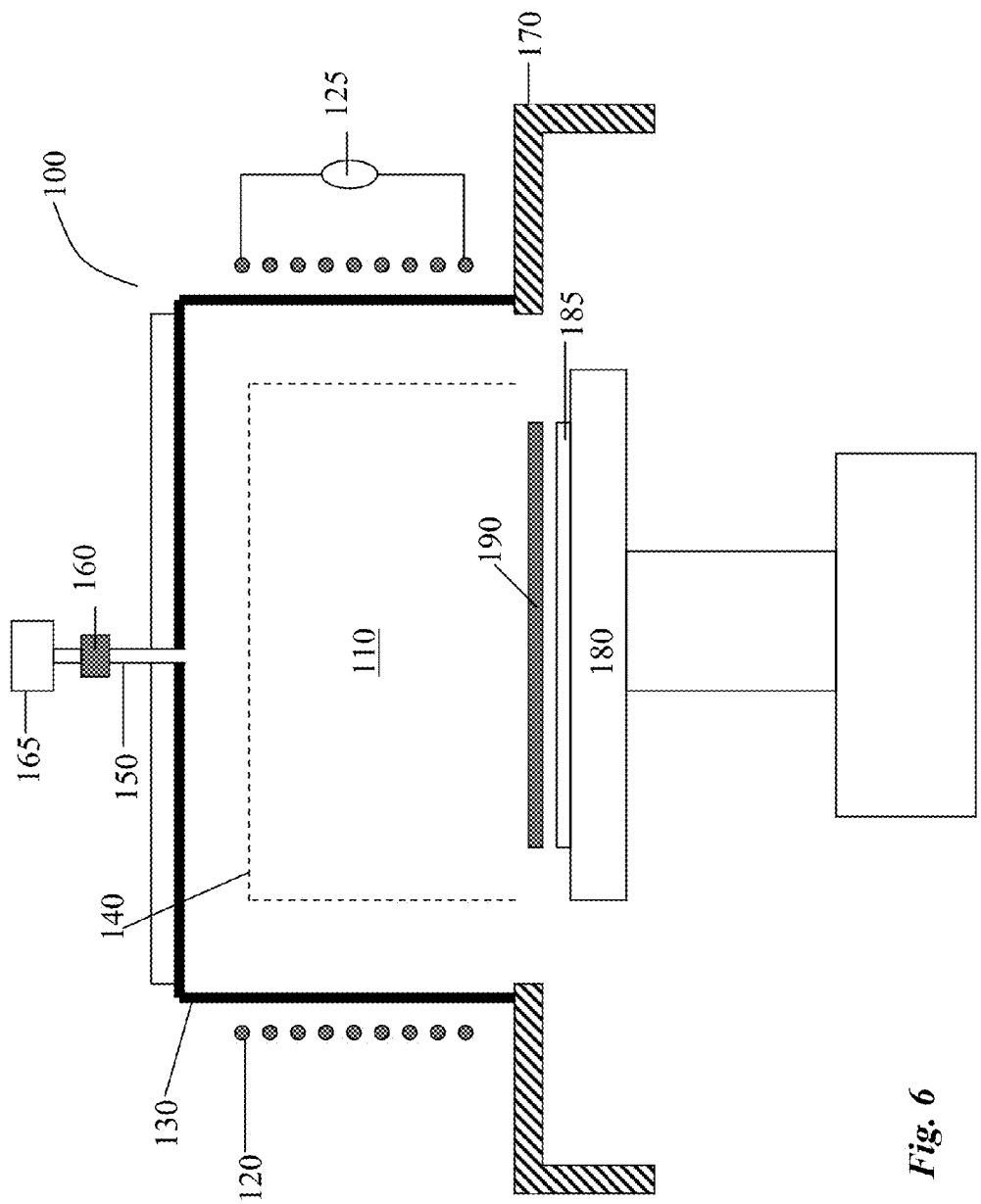
FIG. 6 is a plasma etch chamber in accordance with an embodiment of the invention.

The substrate 200 is placed inside a plasma etch tool and a plasma is generated for etching the native oxide from the bottom surface 203 of the substrate 200. The plasma etch tool is illustrated in FIG. 6 in accordance with embodiments of the invention. The plasma etch tool will be briefly described to clearly describe subsequent processing steps.

The plasma etch tool comprises a chuck 180, which, for example, may include a phenol coated chuck 185, on which a wafer 190 (including the substrate 200) may be placed. Alternatively, the wafer 190 may be placed on pins along the edges of the wafer. The chuck 180 is not grounded and electrically insulated in one or more embodiments.

The plasma etch tool comprises a plasma chamber 110 having, for example, quartz walls 130 over a support 170. The plasma chamber 110 includes inlets 150 and outlets (not shown) for gases for forming the plasma. In various embodiments, the plasma chamber 110 is surrounded by a metal cage 140 comprising e.g., aluminum.

The plasma etch tool comprises inductive coils 120 such as helical coils disposed around the quartz walls 130 and coupled to a power source 125. The power of the inductive coils 120 is about 200 W to about 1000 W, and about 850 W in one embodiment. The inductive coils 120 are coupled to a mid frequency power source 125, for example, between about 100 kHz to about 600 kHz, and about 400 kHz in one embodiment.

In various embodiments, the plasma in the plasma chamber 110 is ignited using microwave ignition cavity and ignition device 160. In one or more embodiments, plasma ignition is achieved by first introducing argon (Ar) into the plasma chamber 110 along with a small amount of hydrogen. The argon flow ratio may be about 1 sccm to about 100 sccm, and about 10 sccm in one embodiment.

The plasma is ignited before increasing the hydrogen content in various embodiments. This avoids the problems of having to ignite the plasma at high hydrogen to argon ratios. In accordance with an embodiment, a source of ions is created using a bright light at the top of the plasma chamber 110 in a separate microwave cavity 165. After plasma ignition, additional hydrogen is added to increase the hydrogen content without loosing the plasma.

In various embodiments, after plasma ignition, hydrogen is added to provide at least 100% hydrogen to argon ratio in the plasma chamber 110 (e.g., 10 sccm hydrogen and 10 sccm argon). In various embodiments, a maximum hydrogen flow rate of 100 sccm may be used, for example, resulting in an 1000% hydrogen to argon ratio (assuming a 10 sccm argon flow rate). In one embodiment, after plasma ignition, 20 sccm of hydrogen is added to provide about 200% hydrogen to argon ratio while maintaining a 10 sccm argon flow rate. While the rate of 10 sccm of argon is used as an example, other flow rates could also be possible in various embodiments.

In one embodiment, after the wafer 190 is placed within the plasma chamber 110, argon at a first flow rate and hydrogen at a second flow rate are introduced. During ignition, the hydrogen flow may be stopped or reduced to a substantially low level e.g., a third flow rate. In one embodiment, the third flow rate is reduced to a negligible amount. If the hydrogen flow was stopped for ignition, then the hydrogen flow is restarted to a fourth flow rate after plasma ignition. Alternatively, after igniting the plasma, the flow rate of hydrogen is increased from the third flow rate to a fourth flow rate.

In one embodiment, hydrogen is passed at the second flow rate for a first duration, at the third flow rate for a second duration, and the plasma is ignited during this second duration. In various embodiments, the third flow rate comprises a negligible flow rate, and the first and the second durations are about equal so that the hydrogen partial pressure drops significantly during the second duration. In one embodiment, the first duration is about 1-5 s and the second duration is about 1-5 s.

The second flow rate and the fourth flow rate are about equal in one embodiment. In one embodiment, the fourth flow rate is about twice the first flow rate. In another embodiment, the third flow rate is less than 50% of the first flow rate. In yet another embodiment, the first flow rate is about 5 sccm to about 20 sccm, wherein the fourth flow rate is between about 10 sccm to about 40 sccm.

In an alternative embodiment, after the wafer 190 is placed within the plasma chamber 110, only argon at a first flow rate is introduced. No hydrogen is introduced at this stage. After the plasma is ignited, hydrogen is introduced at a second flow rate. In one embodiment, after plasma ignition, the first flow rate is about 10 sccm and the second flow rate is about 20 sccm of hydrogen providing about 200% hydrogen to argon ratio. In various embodiments, the first and the second flow rates may be selected suitably as known to one skilled in the art.

In various embodiments, plasma ignition is detected by monitoring the forward power. For forward powers above 500 W, the reflected power is very high until the plasma is ignited and the forward power is below the target. Reflected power is the power reflected by the plasma chamber. Upon ignition the reflected power reduces and the target forward power is achieved.

Another problem associated with high hydrogen content plasma is the difficulty of maintaining stable plasma over a wide range of chamber conditions. In various embodiments, the metal cage 140 inside the quartz chamber stabilizes the plasma thereby making it more robust to changes in chamber conditions such as gas flows, deviations in power supply and others. For example, in one embodiment, the metal cage 140 may help to keep the plasma uniformly around the quartz walls 130 of the plasma chamber 110.

In various embodiments, the plasma etch tool includes a first position and a second position for holding the wafer 190, the first position is lower than the second position. Typical plasma etching is performed in the second position, which is below or inside the plasma region. In various embodiments, the substrate 200 (wafer 190) is placed in a lower first position below the second position in the plasma chamber 110 so as to improve uniformity in etching. The first position places the wafer 190 within the plasma region.

Figure 4:
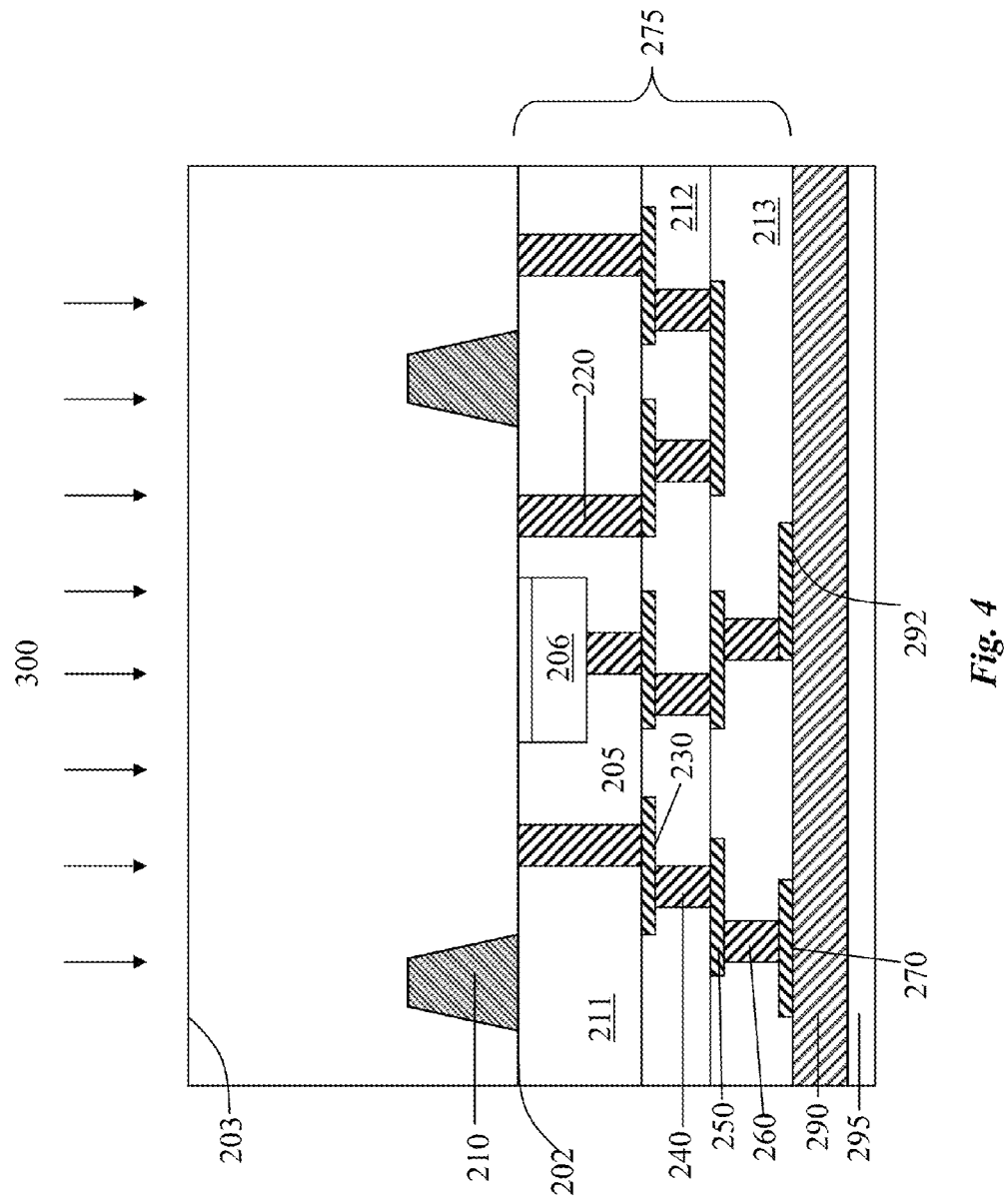

Referring to FIG. 4, a bottom surface 203 of the substrate 200 is exposed to the hydrogen plasma 300 thus created. During etching, the substrate 200 may acquire a self bias voltage. In various embodiments, no attempt is made to control this bias. The self bias is typically 30 V to about 40 V and is generated in response to the wafer 190 being placed in the plasma without grounding. The voltage produced varies slightly and is dependent on the product and plasma environment.

In various embodiments, a mid-frequency plasma excitation is used. In various embodiments, frequencies less than 600 kHz are used. In one embodiment, only a 400 kHz plasma excitation frequency is used. Higher frequencies such as 13.56 MHz used for argon sputtering are not used to avoid crystal structure damage arising from the energetic ion bombardment. In contrast, for argon sputtering both high and mid frequencies are used. The lower frequency creates the plasma while the higher frequency gives the argon ions enough energy to knock out silicon atoms by bombardment.

In various embodiments, in the absence of the 13.56 MHz excitation, there is no etching action until hydrogen is added into the plasma chamber. After the addition of hydrogen, a low etch rate without the heavy ion bombardment is obtained. Although very slow, the etch rate is sufficient to remove the native oxide in reasonable time with good uniformity and therefore subsequently forms good mechanical and ohmic contacts.

Advantageously, hydrogen plasma etching removes carbon contamination without implanting anything into the substrate 200. Further, the contaminants are removed as volatile gases such as $CH_4$, $SiH_2$, and $H_2O$, which do not result in any particle contamination. In contrast, argon sputtering is poor at removing carbon contamination and can actually implant argon and carbon into the surface. HF is also poor at removing carbon and leaves fluorine terminated dangling bonds.

A hydrogen plasma, like an HF, etched silicon surface is hydrophobic. A hydrogen plasma etched silicon surface is also stable in air because of hydrogen terminated dangling bonds. Argon sputtered surfaces are very hydrophilic and slightly n-type due to silicon damage, defects and carbon contamination.

In various embodiments, hydrogen plasma etching does not introduce additional carbon or fluorine. Therefore, the carbon and fluorine levels after hydrogen plasma etching is at the current detection limit of a TOF-SIMS tool while argon sputtering produces about 100× increase in carbon count and HF etch produces about a 100× increase in fluorine count at the interface.

Consequently, use of hydrogen plasma produces cleaner, less damaged surface than either HF etching or argon sputtering. Therefore, the adhesion of hydrogen cleaned surfaces is superior to HF etched or argon sputtered surfaces.

The adhesion may be confirmed, for example, using a scratch test. While a metal layer deposited after conventional etching results in scratching (peeling) of the metal layer, the first metal layer 400 deposited after the hydrogen plasma etching is resistant to scratching and peeling.

The slow etch rates of the hydrogen plasma also result in excellent surface uniformity and surface roughness compared to other types of etching processes. Therefore, in various embodiments, hydrogen plasma etching produces a uniform surface having excellent uniformity and good surface roughness. In one embodiment, the hydrogen plasma etch process maintains a smooth surface obtained after a prior process such as wet etching. In one or more embodiments, the root mean square value of surface roughness of the bottom surface is less than about 1 nm after the hydrogen plasma etching.

In various embodiments, the etch time within the plasma chamber may be timed, for example, to be about 10 s to about 100 s. In one embodiment, the etching is performed for about 25 s.

Figure 5:
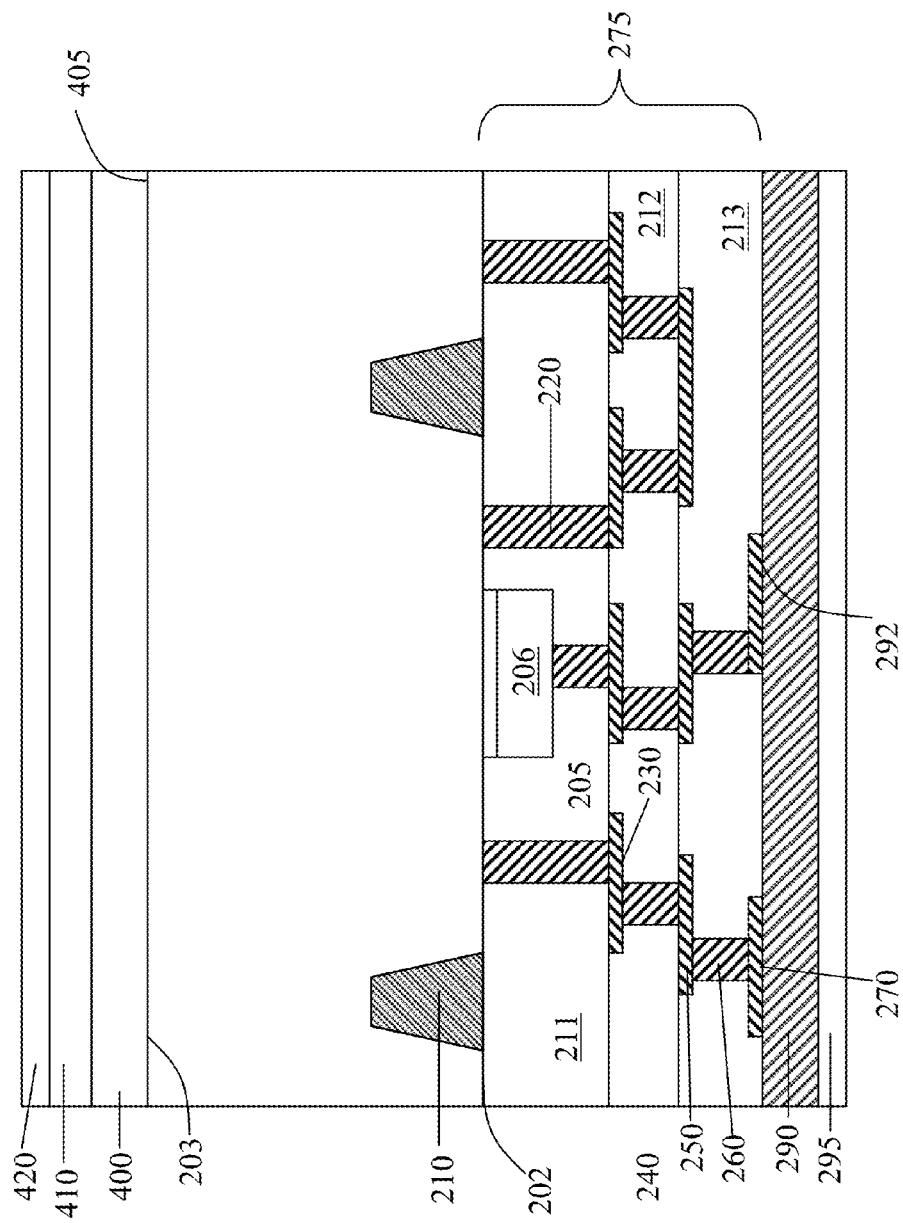

Referring next to FIG. 5, a first metal layer 400 is deposited over the bottom surface 203. In various embodiments, the thickness of the deposited first metal layer 400 is about 10 nm to about 200 nm. The first metal layer 400 may be deposited using a suitable deposition process including sputtering, physical layer deposition, chemical vapor deposition, evaporation, and/or electro-chemical deposition. In various embodiments, titanium or tungsten is deposited as the first metal layer 400. In various embodiments, the first metal layer 400 is deposited without breaking vacuum after the hydrogen plasma. This may be accomplished, for example, in a cluster-line tool having multiple chambers. This helps to avoid formation of a native oxide between the metal deposition and the hydrogen plasma etching, which removed the native oxide.

The uniform surface having no impurities facilitates the formation of a thin silicide layer at the interface between the first metal layer 400 and the substrate 200. In various embodiments, a metal silicide layer 405 is formed without any heating of the substrate 200. The hydrogen terminated silicon atoms are replaced with titanium or tungsten forming few atomic layers having the silicide. In various embodiments, less than about five atomic layers of the metal silicide layer 405 are thereby formed. The metal silicide layer 405 improves the mechanical and ohmic contact in various embodiments.

A second metal layer 410 is deposited over the first metal layer 400. In various embodiments, 100 nm to about 500 nm of a second metal layer 410 are deposited. The second metal layer 410 provides a solder layer for contact formation.

A third metal layer 420 is deposited over the second metal layer 410. In various embodiments 100 nm to about 10000 nm of a third metal layer 420 are deposited. In various embodiments, the third metal layer 420 solders with the second metal layer 410 and may also protect the underlying metals from the environment. Examples of the third metal layer 420 include Au, Ag, Au alloys, Ag alloys, and combinations thereof. In some embodiments, copper may be used as the third metal layer 420. Subsequent processing may follow conventional semiconductor processing.

Although the present invention and its advantages have been described in detail, it should be understood that various changes, substitutions and alterations can be made herein without departing from the spirit and scope of the invention as defined by the appended claims. For example, it will be readily understood by those skilled in the art that many of the features, functions, processes, and materials described herein may be varied while remaining within the scope of the present invention.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A method of fabricating a semiconductor device, the method comprising:
    providing a workpiece having a first bottom surface opposite a top surface with circuitry disposed at the top surface;
    exposing the first bottom surface of the workpiece to a hydrogen plasma, wherein the hydrogen plasma removes a native oxide from the first bottom surface to expose a second bottom surface of the workpiece; and
    depositing a first metal layer over the second bottom surface of the workpiece without breaking vacuum after exposing the first bottom surface to the hydrogen plasma.

2. The method of claim 1 further comprising:
    forming a metal silicide layer on the second bottom surface of the workpiece, the metal silicide layer being formed between the first metal layer and the workpiece.

3. The method of claim 2, wherein the metal silicide layer is less than about five atomic layers in thickness.

4. A method of fabricating a semiconductor device, the method comprising:
    providing a workpiece having a first bottom surface opposite a top surface with circuitry disposed at the top surface;
    exposing the first bottom surface of the workpiece to a hydrogen plasma, wherein the hydrogen plasma removes a native oxide from the first bottom surface to expose a second bottom surface of the workpiece; and
    depositing a first metal layer over the second bottom surface of the workpiece, wherein the first metal layer is deposited as a blanket layer over substantially the entire second bottom surface of the workpiece.

5. The method of claim 4, wherein the first metal layer is deposited without breaking vacuum after exposing the first bottom surface to the hydrogen plasma.

6. The method of claim 2, wherein the first metal layer comprises titanium or tungsten.

7. The method of claim 1, wherein the hydrogen plasma is performed at a plasma excitation frequency between about 100 kHz to about 600 kHz.

8. A method of fabricating a semiconductor device, the method comprising:
    providing a workpiece having a first bottom surface opposite a top surface with circuitry disposed at the top surface; and
    exposing the first bottom surface of the workpiece to a hydrogen plasma, wherein the hydrogen plasma removes a native oxide from the first bottom surface to expose a second bottom surface of the workpiece, wherein the workpiece is electrically floating when exposing the first bottom surface of the workpiece to the hydrogen plasma.

9. The method of claim 1, wherein the second bottom surface is hydrophobic.

10. A method of fabricating a semiconductor device, the method comprising:
- providing a workpiece having a first bottom surface opposite a top surface with circuitry disposed at the top surface; and
- exposing the first bottom surface of the workpiece to a hydrogen plasma, wherein the hydrogen plasma removes a native oxide from the first bottom surface to expose a second bottom surface of the workpiece, wherein exposing the first bottom surface of the workpiece to the hydrogen plasma comprises
  - placing the workpiece in a plasma etch tool chamber,
  - flowing argon at a first flow rate and hydrogen at a second flow rate,
  - stopping the flow of hydrogen,
  - igniting the hydrogen plasma after stopping the flow of hydrogen, and
  - flowing hydrogen to a third flow rate after igniting.

11. The method of claim 10, wherein the third flow rate is about twice the first flow rate.

12. The method of claim 10, wherein the second flow rate is less than 50% of the first flow rate.

13. The method of claim 10, wherein the first flow rate is about 5 sccm to about 20 sccm, wherein the second flow rate is between about 10 sccm to about 40 sccm, wherein the third flow rate is between about 10 sccm to about 40 sccm.

14. A method of fabricating a semiconductor device, the method comprising:
- providing a workpiece having a first bottom surface opposite a top surface with circuitry disposed at the top surface; and
- exposing the first bottom surface of the workpiece to a hydrogen plasma, wherein the hydrogen plasma removes a native oxide from the first bottom surface to expose a second bottom surface of the workpiece, wherein exposing the first bottom surface of the workpiece to the hydrogen plasma comprises
  - placing the workpiece in a plasma etch tool chamber,
  - flowing argon at a first flow rate and hydrogen at a second flow rate,
  - reducing the flow of hydrogen from the second flow rate to a third flow rate,
  - igniting the hydrogen plasma after reducing the flow of hydrogen, and
  - increasing the flow of hydrogen from a third flow rate to a fourth flow rate after igniting.

15. A method of fabricating a semiconductor device, the method comprising:
- providing a workpiece having a first bottom surface opposite a top surface with circuitry disposed at the top surface; and
- exposing the first bottom surface of the workpiece to a hydrogen plasma wherein the hydrogen plasma removes a native oxide from the first bottom surface to expose a second bottom surface of the workpiece, wherein exposing the first bottom surface of the workpiece to the hydrogen plasma comprises
  - placing the workpiece in a plasma etch tool chamber,
  - flowing argon at a first flow rate,
  - igniting a plasma after flowing argon, and
  - introducing hydrogen at a second flow rate after igniting.

16. A method of fabricating a semiconductor device, the method comprising:
- forming a doped region on a top surface of a workpiece, the workpiece having a first bottom surface opposite the top surface;
- after forming the doped region, placing the workpiece in a plasma etch tool chamber;
- flowing argon at a first flow rate and hydrogen at a second flow rate into the plasma etch tool chamber;
- stopping the flow of hydrogen into the plasma etch tool chamber;
- igniting a hydrogen plasma after stopping the flow of hydrogen; and
- after igniting, flowing hydrogen at a third flow rate, wherein the hydrogen plasma removes a native oxide from the first bottom surface to expose a second bottom surface of the workpiece.

17. The method of claim 16, wherein a root mean square value of surface roughness of the second bottom surface is less than about 1 nm.

18. The method of claim 16, wherein the third flow rate is about twice the first flow rate.

19. The method of claim 16, wherein the second flow rate is the same as the third flow rate.

20. The method of claim 16 further comprising:
- without breaking vacuum after exposing the first bottom surface to the hydrogen plasma depositing a first metal layer over the second bottom surface of the workpiece thereby forming a metal silicide layer on the second bottom surface of the workpiece, the metal silicide layer being formed between the first metal layer and the workpiece.

21. The method of claim 20, wherein the metal silicide layer is less than about five atomic layers in thickness.

22. A method of fabricating a semiconductor device, the method comprising:
- exposing a first back side surface of a substrate comprising a native oxide layer at the first back side surface to a hydrogen plasma, wherein the substrate has no circuitry at a back side comprising the first back side surface, wherein the hydrogen plasma removes the native oxide layer from the first back side surface to expose a second back side surface of the substrate, and wherein a root mean square value of surface roughness of the second back side surface is less than about 1 nm.

23. The method of claim 22, wherein exposing the first back side surface comprises:
- placing the substrate in a plasma etch tool chamber;
- flowing argon at a first flow rate and hydrogen at a second flow rate;
- stopping the flow of hydrogen;
- igniting the hydrogen plasma after stopping the flow of hydrogen; and
- flowing hydrogen to a third flow rate after igniting.

24. A method of fabricating a semiconductor device, the method comprising:
- forming metallization layers over a top surface of a workpiece, the workpiece having a bottom surface opposite the top surface;
- forming a metal silicide layer on the bottom surface of the workpiece, wherein the metal silicide layer is less than about five atomic layers in thickness;
- forming a first metal layer over the metal silicide layer, wherein a metal of the first metal layer is the same as a metal of the metal silicide layer;
- forming a second metal layer over the first metal layer; and
- forming a third metal layer over the second metal layer, wherein the third metal layer comprises silver.

25. The method of claim 24, further comprising forming a functional element proximate the top surface of the workpiece.

26. The method of claim 24, wherein a root mean square value of surface roughness of the bottom surface is less than about 1 nm.

27. The method of claim 24, wherein the metal silicide layer is formed over at least 80% of the bottom surface of the workpiece.

28. The method of claim 24, wherein the metal comprises titanium.

29. The method of claim 24, wherein the metal comprises titanium and tungsten.

30. A method of fabricating a semiconductor device, the method comprising:
forming metallization layers over a top surface of a workpiece, the workpiece having a bottom surface opposite the top surface;
forming a metal silicide layer on the bottom surface of the workpiece, wherein the metal silicide layer is less than about five atomic layers in thickness;
forming a first metal layer over the metal silicide layer, wherein a metal of the first metal layer is the same as a metal of the metal silicide layer; and
forming a second metal layer over the first metal layer, wherein the second metal layer comprises nickel-vanadium.

31. The method of claim 30, further comprising:
forming a third metal layer over the second metal layer.

32. The method of claim 31, wherein the third metal layer comprises silver.

33. A method of forming a semiconductor device, the method comprising:
providing a semiconductor substrate having a bottom surface opposite a top surface with active devices disposed at the top surface;
forming a metal silicide layer on the bottom surface of the semiconductor substrate, wherein the metal silicide layer is less than about 2 nm in thickness; and
forming a first metal layer over the metal silicide layer, wherein a metal of the first metal layer is the same as a metal of the metal silicide layer.

34. The method of claim 33, wherein a root mean square value of surface roughness of the bottom surface is less than about 1 nm.

35. The method of claim 33, wherein the metal silicide layer is formed over at least 80% of the bottom surface.

36. The method of claim 33, wherein the metal comprises titanium or tungsten.

37. The method of claim 1, wherein a root mean square value of surface roughness of the second bottom surface is less than about 1 nm.

38. The method of claim 15, further comprising:
depositing a first metal layer over the second bottom surface of the workpiece; and
forming a metal silicide layer on the second bottom surface of the workpiece, the metal silicide layer being formed between the first metal layer and the workpiece.

39. The method of claim 38, wherein the first metal layer is deposited without breaking vacuum after exposing the first bottom surface to the hydrogen plasma.

40. The method of claim 38, wherein the first metal layer is deposited as a blanket layer over substantially the entire second bottom surface of the workpiece.

41. The method of claim 38, wherein the first metal layer comprises titanium or tungsten.

42. The method of claim 15, wherein the hydrogen plasma is performed at a plasma excitation frequency between about 100 kHz to about 600 kHz.

43. The method of claim 15, wherein the second bottom surface is hydrophobic.

44. The method of claim 15, wherein the second flow rate is about twice the first flow rate.

45. The method of claim 15, wherein the first flow rate is about 5 sccm to about 20 sccm, wherein the second flow rate is between about 10 sccm to about 40 sccm.

46. The method of claim 33, wherein the metal silicide layer is formed as a blanket layer over substantially the entire bottom surface.

47. The method of claim 33, wherein the first metal layer is formed as a blanket layer over substantially the entire bottom surface.

48. A method of fabricating a semiconductor device, the method comprising:
providing a workpiece having a first bottom surface opposite a top surface with circuitry disposed at the top surface, wherein the workpiece comprises a native oxide layer at the first bottom surface; and
exposing the first bottom surface of the workpiece to a hydrogen plasma, wherein the hydrogen plasma removes the native oxide layer from the first bottom surface to expose a second bottom surface of the workpiece.

49. The method of claim 48, wherein a root mean square value of surface roughness of the second bottom surface is less than about 1 nm.

* * * * *